United States Patent
Zhang et al.

(10) Patent No.: US 9,759,966 B2
(45) Date of Patent: Sep. 12, 2017

(54) ARRAY SUBSTRATE AND METHOD OF MANUFACTURING THE SAME, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Pengju Zhang, Beijing (CN); Xin Li, Washington, DC (US); Bin Li, Beijing (CN); Detao Zhao, Beijing (CN); Xuchen Yuan, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/253,095

(22) Filed: Aug. 31, 2016

(65) Prior Publication Data
US 2017/0192319 A1    Jul. 6, 2017

(30) Foreign Application Priority Data
Jan. 6, 2016    (CN) .......................... 2016 1 0007356

(51) Int. Cl.
| | | |
|---|---|---|
| *H01L 27/02* | (2006.01) | |
| *G02F 1/1362* | (2006.01) | |
| *G02F 1/1368* | (2006.01) | |
| *G02F 1/1343* | (2006.01) | |
| *H01L 27/32* | (2006.01) | |
| *G02F 1/1341* | (2006.01) | |
| *G02F 1/1335* | (2006.01) | |

(52) U.S. Cl.
CPC ...... *G02F 1/136204* (2013.01); *G02F 1/1368* (2013.01); *G02F 1/134309* (2013.01); *G02F 1/136286* (2013.01); *H01L 27/0248* (2013.01); *H01L 27/3272* (2013.01); *G02F 1/1341* (2013.01); *G02F 1/13439* (2013.01); *G02F 1/133514* (2013.01); *G02F 1/136227* (2013.01); *G02F 2201/122* (2013.01); *G02F 2201/123* (2013.01); *H01L 2227/323* (2013.01)

(58) Field of Classification Search
CPC ....................................................... H01L 21/70
See application file for complete search history.

(56) References Cited

U.S. PATENT DOCUMENTS

| | | | |
|---|---|---|---|
| 2008/0024407 A1* | 1/2008 | Yamaguchi | G02F 1/13452 345/87 |
| 2016/0117039 A1* | 4/2016 | Zhao | G06F 3/0416 345/173 |

FOREIGN PATENT DOCUMENTS

CN    103676266 A    3/2014

* cited by examiner

*Primary Examiner* — Cheung Lee
(74) *Attorney, Agent, or Firm* — Banner & Witcoff, Ltd.

(57) ABSTRACT

An array substrate and a method of manufacturing the same, and a display device are disclosed. The array substrate includes a base substrate; a pixel electrode, a thin film transistor, a gate line and a data line that are provided on the base substrate; and an electrostatic shielding layer provided on the base substrate. The electrostatic shielding layer is configured for electrostatic protection during production of the array substrate.

11 Claims, 4 Drawing Sheets

ARRAY SUBSTRATE AND METHOD OF MANUFACTURING THE SAME, AND DISPLAY DEVICE

This application claims priority to and the benefit of Chinese Patent Application No. 201610007356.7 filed on Jan. 6, 2016, which application is incorporated herein in its entirety.

TECHNICAL FIELD

Embodiments of the present disclosure relate to an array substrate and a method of manufacturing the same, and a display device.

BACKGROUND

With the continuous improvement of display technologies, the standards for display devices are increasingly raised as well. In a variety of display technologies, the TFT-LCD (Thin Film Transistor Liquid Crystal Display) technology has been extensively applied in various display fields owing to its advantages such as low consumption and low cost.

A liquid crystal display (LCD) panel mainly includes an array substrate (a TFT substrate), a color filter substrate and a liquid crystal layer between the substrates. In the production process of an array substrate, some static electricity will inevitably be produced on the array substrate because a production equipment may contact the array substrate; and charge release may make it easy for the array substrate to suffer from electro-static discharge (abbreviated as ESD), thereby resulting in poor products.

SUMMARY

An embodiment of the present disclosure provides an array substrate, comprising: a base substrate, a pixel electrode, a thin film transistor, a gate line and a data line that are provided on the base substrate, and an electrostatic shielding layer provided on the base substrate, wherein the electrostatic shielding layer is configured for electrostatic protection during production of the array substrate.

Another embodiment of the present disclosure provides a display device, comprising the above array substrate.

Still another embodiment of the present disclosure provides a method of manufacturing an array substrate, comprising: forming a pixel electrode, a thin film transistor, a gate line and a data line on a base substrate, and forming an electrostatic shielding layer on the base substrate, the electrostatic shielding layer being configured for electrostatic protection during production of the array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
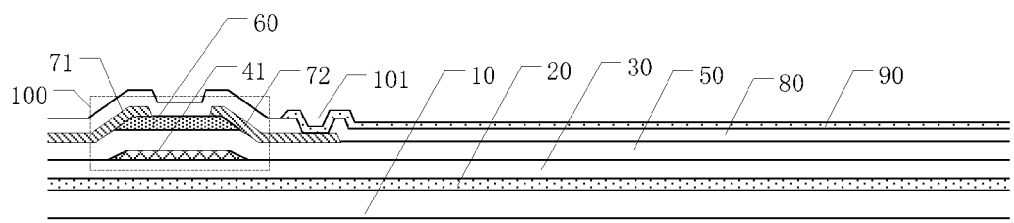
FIG. 1 is a schematic view of an array substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the present disclosure provides an array substrate, comprising a base substrate, wherein the base substrate is provided with a pixel electrode, a thin film transistor, a gate line and a data line and the base substrate is further provided with an electrostatic shielding layer which is configured for electrostatic protection during production of the array substrate.

In the array substrate according to embodiments of the present disclosure, the electrostatic shielding layer provided on the base substrate can effectively disperse the static electricity produced during the production process of the array substrate, thereby avoiding production of poor products resulting from electro-static discharge of array substrates and improving product yield.

In the array substrate according to embodiments of the present disclosure, the position of the electrostatic shielding layer can be set depending upon specific circumstances. For example, the electrostatic shielding layer can be disposed on the first layer structure on the surface of the base substrate; during production of the array substrate, the electrostatic shielding layer is first produced on the base substrate; during subsequent production of other structures, the electrostatic shielding layer can effectively disperse the static electricity produced during the production process, thereby preventing electrostatic charge from damaging the array substrate.

FIG. 1 is a schematic view of an array substrate according to an embodiment of the disclosure. The array substrate comprises a base substrate 10 which is provided with a pixel electrode 90, a passivation layer (PVX layer) 80, a thin film transistor (TFT) 100, a gate line, and a data line. The thin film transistor 100 comprises an active layer 60, a gate insulation layer 50, a gate electrode 41, a source electrode 71 and a drain electrode 72, the gate electrode 41 being connected to the gate line, the source electrode 71 being connected to the data line, and the pixel electrode 90 being connected to the drain electrode 72 through a via hole in the passivation layer 80.

The base substrate 10 is further provided with an electrostatic shielding layer 20 which is configured for electrostatic protection during production of the array substrate and which is provided with an insulation layer 30 on its side away from the base substrate 10. The pixel electrode 90, the passivation layer 80, the thin film transistor 100, the gate line and the data line are all provided on the side of the insulation layer 30 away from the electrostatic shielding layer 20. The insulation layer 30 may be made of an insulation material such as SiN (silicon nitride), a resin or the like, so as to isolate the electrostatic shielding layer 20 from other structures of the array substrate, thereby avoiding short circuit and other adverse effects.

The electrostatic shielding layer 20 may be made of a conductive material with low resistivity such as a metal material like copper and aluminum, e.g., a transparent conductive material such as ITO (indium tin oxide), IZO (indium zinc oxide), CTO (cadmium tin oxide) or the like, so as to reduce the influence of the electrostatic shielding layer on the light transmittance of the array substrate.

Figure 2:
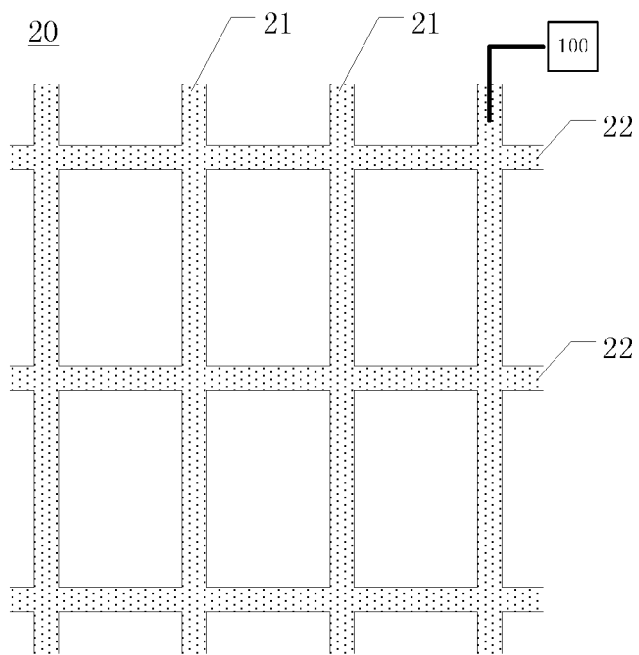
FIG. 2 is a schematic view of an electrostatic shielding layer according to an embodiment of the present disclosure.
Figure 3:
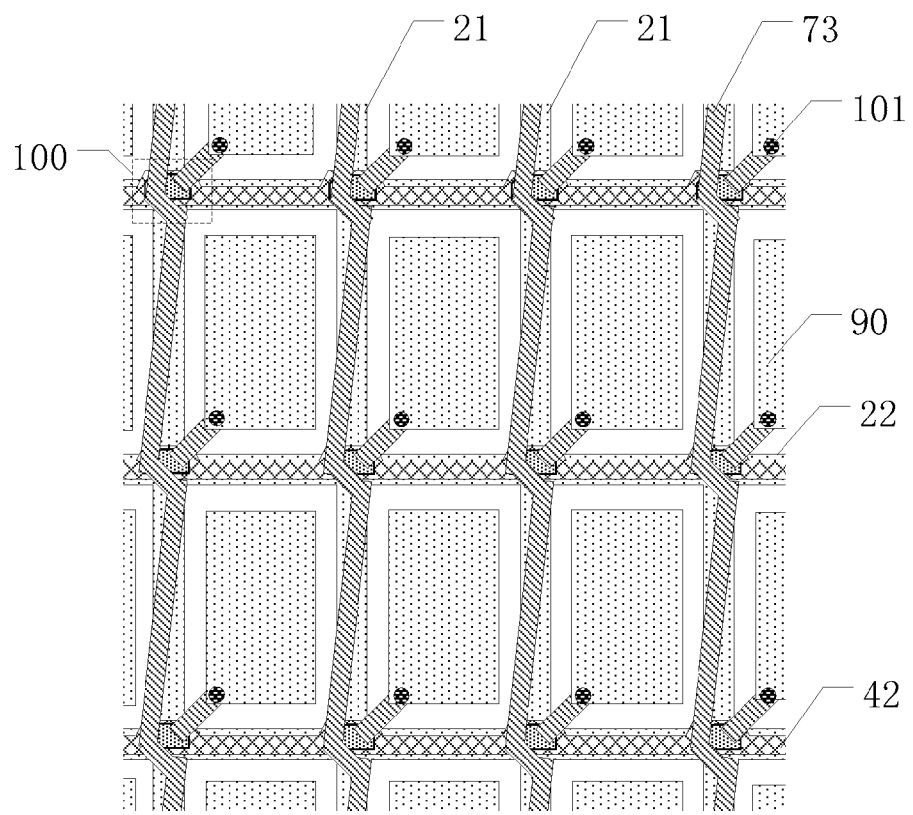
FIG. 3 is a schematic view of disposition of an electrostatic shielding layer according to an embodiment of the present disclosure.

The pattern of the electrostatic shielding layer 20 can be set depending upon specific circumstances, e.g., a grid pattern can be employed. Referring to FIG. 2, the electrostatic shielding layer 20 comprises a plurality of longitudinal portions 21 and a plurality of transverse portions 22, and the plurality of longitudinal portions 21 and the plurality of transverse portions 22 intersect to form a grid pattern. For example, in order to further increase the aperture ratio of the array substrate, as to the array substrate illustrated in FIG. 1, the manner as illustrated in FIG. 3 can be employed, i.e., the longitudinal portions 21 of the electrostatic shielding layer 20 are provided below the data lines 73 while the transverse portions 22 thereof are provided below the gate lines 42. In addition, with a reasonably designed size, the projection of the plurality of longitudinal portions on the array substrate is within the projection of the data lines on the array substrate, and the projection of the plurality of transverse portions on the array substrate is within the projection of the gate lines on the array substrate, so as to improve the light transmittance of the array substrate as much as possible.

For example, regarding the array substrate described above, a layer of a transparent or non-transparent conductive film can be first deposited on the base substrate over a large area, and the conductive film is then patterned (including processes such as exposure, development, etching and the like) so as to produce an electrostatic shielding layer having the desired shape on the base substrate. Afterwards, an insulation layer for isolation is produced followed by sequentially producing a gate metal layer (including a gate electrode and a gate line), a gate insulation layer, an active layer, a source-drain (SD) metal layer (including a source electrode, a drain electrode and a data line), a passivation layer and a pixel electrode. During the above production process, because the electrostatic shielding layer is first produced on the base substrate, the other subsequent production processes can effectively disperse the static electricity produced during these production processes, thereby avoiding product scrap resulting from electro-static discharge of the array substrates caused by electrostatic charge release and improving product yield.

Figure 4:
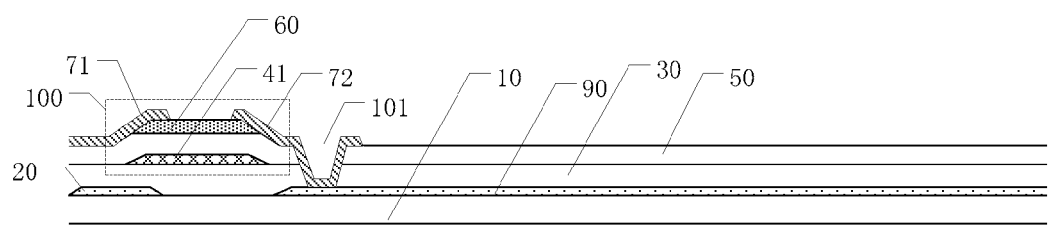
FIG. 4 is a schematic view of another array substrate according to an embodiment of the present disclosure.

FIG. 4 is a schematic view of another array substrate according to embodiments of the present disclosure. The array substrate comprises a base substrate 10 which is provided with an electrostatic shielding layer 20, a pixel electrode 90, an insulation layer 30, a thin film transistor (TFT) 100, a gate line, and a data line, wherein the thin film transistor 100 comprises an active layer 60, a gate insulation layer 50, a gate electrode 41, a source electrode 71 and a drain electrode 72, the gate electrode 41 being connected to the gate line and the source electrode 71 being connected to the data line.

The electrostatic shielding layer 20 and the pixel electrode 90 are disposed in the same layer and are made of the same material; both of them are provided below the insulation layer 30; the thin film transistor 100, the gate line and the data line are all provided on the side of the insulation layer 30 away from the electrostatic shielding layer 20; the drain electrode 72 of the thin film transistor 100 is connected to the pixel electrode 90 through a via hole 101 in the gate insulation layer 50 and the insulation layer 30.

Figure 5:
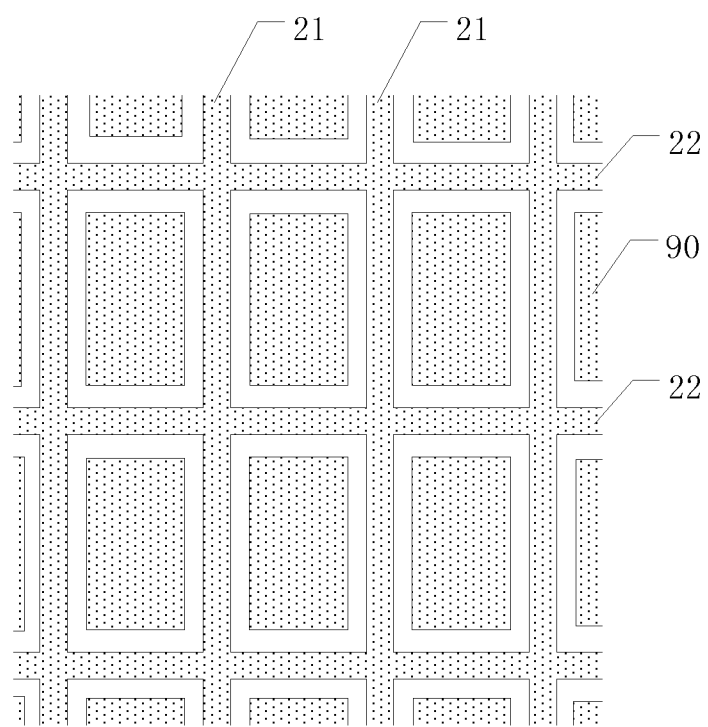
FIG. 5 is a schematic view of a pattern formed by the electrostatic shielding layer and a pixel electrode in the array substrate as illustrated in FIG. 4.
Figure 6:
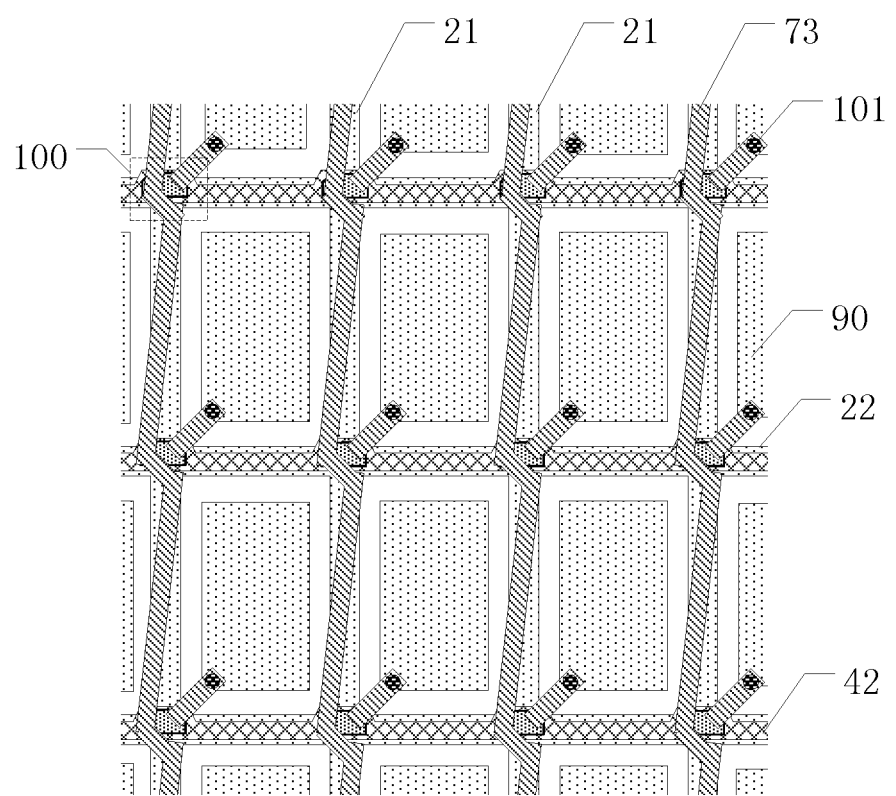
FIG. 6 is a schematic view of disposition of the electrostatic shielding layer in the array substrate as illustrated in FIG. 4.

The material of the electrostatic shielding layer 20 and the pixel electrode 90 can be a transparent conductive material such as ITO (indium tin oxide), IZO (indium zinc oxide), CTO (cadmium tin oxide) or the like, and their patterns formed on the base substrate are as illustrated in FIG. 5. The electrostatic shielding layer 20 comprises a plurality of longitudinal portions 21 and a plurality of transverse portions 22, and the plurality of longitudinal portions 21 and the plurality of transverse portions 22 intersect to form a grid pattern. Pixel electrodes 90 are provided in the grid formed by the electrostatic shielding layer 20. In addition, the positions of the electrostatic shielding layer 20 and the gate lines and the data lines are as illustrated in FIG. 6; the longitudinal portions 21 of the electrostatic shielding layer 20 are provided below the data lines 73 and the transverse portions 22 are provided below the gate lines 42 such that each pixel electrode can be provided in a corresponding one of the sub-pixel regions divided by the date lines and the gate lines. Besides, with a reasonably designed size, the projection of the plurality of longitudinal portions on the array substrate is within the projection of the data lines on the array substrate, and the projection of the plurality of transverse portions on the array substrate is within the projection of the gate lines on the array substrate, so as to improve the light transmittance of the array substrate as much as possible.

For example, as for the array substrate in the present embodiment, a layer of a transparent conductive film is first deposited on the base substrate; the transparent conductive film is patterned so as to form an electrostatic shielding layer and a pixel electrode simultaneously on the base substrate, and then an insulation layer for isolation is formed thereon followed by sequentially producing a gate metal layer, a gate insulation layer, and an active layer on the insulation layer configured for isolation. By producing a via hole in the insulation layer and the gate insulation layer, the drain electrode in the SD metal layer subsequently produced can be connected to the pixel electrode through the via hole. In the above production process, because the electrostatic shielding layer is first produced on the base substrate, the other subsequent production processes can effectively disperse the static electricity produced during these production processes, thereby avoiding product scrap resulting from electro-static discharge of the array substrate caused by electrostatic charge release and improving product yield.

As to the array substrate according to embodiments of the present disclosure, by disposing the electrostatic shielding layer and the pixel electrode layer in the same layer, they can be simultaneously formed in a same patterning process, which not only prevents the electro-static discharge of the array substrate resulting from electrostatic charge release, but also reduces the number of patterning processes and the cost.

For example, the array substrate in an embodiment of the present disclosure may further comprise a ground circuit; by connecting the electrostatic shielding layer to the ground circuit, the electrical potential of the electrostatic shielding layer can be further lowered, which further reduces the ESD risk. For example, referring to FIG. 2, the electrostatic shielding layer 20 is electrically connected to the ground circuit 100.

Embodiments of the present disclosure further provide a display device, comprising any one of the above described array substrates.

An example of the display device is a liquid crystal display device, in which the array substrate and an opposed substrate are disposed opposite to each other so as to form a liquid crystal cell, and a liquid crystal material is filled in the liquid crystal cell. The opposed substrate is, for example, a color filter substrate. The pixel electrode in each pixel unit (defined by intersection of the gate line and the data line) of the array substrate acts to apply an electric field for controlling the rotation degree of the liquid crystal material, so as to conduct a display operation. In some examples, the liquid crystal display device further comprises a backlight source used to provide backlight for the array substrate.

Another example of the display device is an organic light-emitting diode (OLED) display device, in which a pixel electrode in each pixel unit (defined by intersection of the gate line and the data line) of the array substrate functions as an anode or a cathode for driving an organic light emitting material to emit light, so as to conduct a display operation.

Still another example of the display device is an e-ink display device, an e-ink layer is provided on the array substrate, the pixel electrode in each pixel unit (defined by intersection of the gate line and the data line) is configured to drive the charged particles to move to conduct a display operation.

The display device according to embodiments of the present disclosure can be any product or component having display function such as a laptop screen, a liquid crystal display, a liquid crystal TV set, a digital photo frame, a mobile phone, a tablet, or the like.

Embodiments of the present disclosure further provide a method of manufacturing an array substrate, comprising forming a pixel electrode, a thin film transistor, a gate line and a data line on a base substrate, and further comprising forming an electrostatic shielding layer on the base substrate, the electrostatic shielding layer being configured for electrostatic protection during production of the array substrate.

For example, forming of the thin film transistor, the gate line and the data line is conducted after forming of the electrostatic shielding layer; and an insulation layer is formed on the electrostatic shielding layer after forming of the electrostatic shielding layer and prior to forming of the thin film transistor, the gate line and the data line.

For example, in order to form the electrostatic shielding layer on the base substrate, a plurality of longitudinal portions and a plurality of transverse portions can be formed, and the plurality of longitudinal portions and the plurality of transverse portions intersect to form a grid pattern.

For example, the projection of the plurality of longitudinal portions on the array substrate is provided within the projection of the data lines on the array substrate, and the projection of the plurality of transverse portions on the array substrate is provided within the projection of the gate lines on the array substrate.

For example, in order to reduce the number of patterning processes, the electrostatic shielding layer and the pixel electrode layer can be simultaneously formed in a patterning process.

The above are merely exemplary embodiments of the present disclosure, and are not intended to limit the scope of protection of the present disclosure, which is yet determined by the appended claims.

The present application claims the priority of the Chinese patent application No. 201610007356.7 submitted on Jan. 6, 2016, and the content disclosed in the above Chinese patent application is incorporated herein by reference as part of the present application.

What is claimed is:

1. An array substrate, comprising:
a base substrate,
a pixel electrode, a thin film transistor, a gate line and a data line that are provided on the base substrate, and
an electrostatic shielding layer provided on the base substrate, wherein the electrostatic shielding layer is configured for electrostatic protection during production of the array substrate,
wherein the electrostatic shielding layer comprises a plurality of longitudinal portions and a plurality of transverse portions, and the plurality of longitudinal portions and the plurality of transverse portions intersect to form a grid pattern.

2. The array substrate according to claim 1, further comprising an insulation layer that is provided on a side of the electrostatic shielding layer away from the base substrate, wherein the thin film transistor, the gate line and the data line are all provided on a side of the insulation layer away from the electrostatic shielding layer.

3. The array substrate according to claim 1, wherein the array substrate comprises a plurality of gate lines and a plurality of data lines, a projection of the plurality of longitudinal portions on the array substrate is provided within a projection of the data lines on the array substrate, and a projection of the plurality of transverse portions on the array substrate is provided within a projection of the gate lines on the array substrate.

4. The array substrate according to claim 1, wherein the electrostatic shielding layer and the pixel electrode layer are disposed in a same layer and are made of a same material.

5. The array substrate according to claim 1, further comprising a ground circuit, wherein the electrostatic shielding layer is electrically connected to the ground circuit.

6. A display device, comprising the array substrate according to claim 1.

7. The display device according to claim 6, wherein the display device is a liquid crystal display device, an organic light-emitting diode display device, or an e-ink display device.

8. A method of manufacturing an array substrate, comprising:
   forming a pixel electrode, a thin film transistor, a gate line and a data line on a base substrate, and
   forming an electrostatic shielding layer on the base substrate, the electrostatic shielding layer being configured for electrostatic protection during production of the array substrate,
   wherein the electrostatic shielding layer comprises a plurality of longitudinal portions and a plurality of transverse portions, and the plurality of longitudinal portions and the plurality of transverse portions intersect to form a grid pattern.

9. The method of manufacturing an array substrate according to claim 8, wherein forming of the thin film transistor, the gate line and the data line is conducted after forming of the electrostatic shielding layer; and the method further comprises:
   forming an insulation layer on the electrostatic shielding layer after forming of the electrostatic shielding layer and prior to forming of the thin film transistor, the gate line and the data line.

10. The method of manufacturing an array substrate according to claim 8, wherein a plurality of gate lines and a plurality of data lines are formed, a projection of the plurality of longitudinal portions on the array substrate is provided within a projection of the data lines on the array substrate, and a projection of the plurality of transverse portions on the array substrate is provided within a projection of the gate lines on the array substrate.

11. The method of manufacturing an array substrate according to claim 8, wherein the electrostatic shielding layer and the pixel electrode are simultaneously formed in a patterning process.

* * * * *